(12) United States Patent
Hirano

(10) Patent No.: US 6,801,054 B2
(45) Date of Patent: Oct. 5, 2004

(54) OUTPUT BUFFER CIRCUIT

(75) Inventor: Kazutoshi Hirano, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/419,342

(22) Filed: Apr. 21, 2003

(65) Prior Publication Data

US 2003/0197526 A1 Oct. 23, 2003

(30) Foreign Application Priority Data

Apr. 23, 2002 (JP) ........................................ 2002-120885

(51) Int. Cl.$^7$ .......................................... H03K 19/0175
(52) U.S. Cl. ............................. 326/86; 326/30; 326/90; 327/108; 710/100; 710/126
(58) Field of Search ............... 326/86, 90, 30, 326/93, 95, 9; 327/108–112; 710/100, 126

(56) References Cited

U.S. PATENT DOCUMENTS

| | | | |
|---|---|---|---|
| 5,371,420 A | * 12/1994 | Nakao | 326/27 |
| 6,424,170 B1 | * 7/2002 | Raman et al. | 326/30 |
| 6,515,503 B2 | * 2/2003 | Griffin et al. | 326/30 |
| 6,697,286 B2 | * 2/2004 | Nakagawa | 365/189.05 |

* cited by examiner

Primary Examiner—Vibol Tan
(74) Attorney, Agent, or Firm—Darryl G. Walker; Bradley T. Sako

(57) ABSTRACT

An output buffer circuit is disclosed that can enhance AC performance and suppress reflected noise. An output buffer circuit can include a first driver circuit ($2_1$) and at least one second driver circuit ($2_n$) for sending signals on a transmission line. A first driver circuit ($2_1$) can have an output impedance that essentially matches a characteristic impedance of the transmission line. A signal judging circuit (1) can determine when an input data signal (DATA) makes a transition. During such transition times, a signal may be driven on the transmission line by both the first and second driver circuits ($2_1$ to $2_n$) according to the input data signal. When the input signal data has the same value for a predetermined amount of time, a signal may be driven on the transmission line by the first driver circuit ($2_1$), and not the second driver circuit ($2_n$) according to the input data signal. Transitions in an input data signal may be represented by data signals of a signal judging circuit (1) having different values. A continuously same input data signal may be represented by data signals of the signal judging circuit (1) having the same values.

20 Claims, 4 Drawing Sheets

OUTPUT BUFFER CIRCUIT

TECHNICAL FIELD

The present invention relates generally to an output buffer for sending data signals, and more particularly to an output buffer suitable for use in high-speed data transfer.

BACKGROUND OF THE INVENTION

In recent years the operation speeds of central processing units (CPUs), and the like, have continued to increase. As a result, in computer systems and the like, the speed at which data must be transferred between semiconductor devices, or printed circuit boards containing such devices, has also increased. To meet such higher data transfer speeds, high speed transmission line structures are typically employed. For example, a motherboard can include micro-striplines for transmitting data signals, or coaxial cables are included for connecting circuits on a printed circuit boards, or for connecting to printed circuit boards.

In the case of low frequency signals having relatively low data transmission rates, a signal wavelength can be much longer than a transmission line length. Thus, a signal phase can be nearly identical on all portions of the transmission line at a given time. As a result, even if noise is generated by signal reflection arising from impedance mismatch, because such noise is in phase with the signal, the signal waveform is not substantially deteriorated.

However, in the case of a high frequency signal, a signal waveform may become much shorter than the length of a transmission line. Thus, a signal phase varies according to the particular portion of the transmission line. As a result, the phase at which reflected noise affects the transmitted signal may not be known, and it can be possible for the reflected noise to significantly deteriorate signal quality.

One general way to address the above drawbacks for high frequency signals can be termination processing. Termination processing can include providing an impedance at a signal matching end or signal transmission end that matches a characteristic impedance of the transmission line. This can suppress noise generated by reflected signals.

FIG. 6 is a circuit diagram showing one example of a parallel termination arrangement made on a signal reception end. FIG. 7 is a circuit diagram showing one example of a series (or serial) termination made on a signal transmission end.

Referring now to FIG. 6, in a parallel termination arrangement a signal receiving end can be connected to a power supply voltage or ground potential through a resistor (terminal or terminating resistor). A terminal resistor can have an impedance equal to a characteristic impedance of the transmission line. In contrast, in the series termination arrangement of FIG. 7, a number of driver circuits (i.e., n driver stages, where n is a positive integer) can be arranged at a signal transmission end and operated in parallel. Each driver stage includes a p-channel metal-oxide-semiconductor field effect transistor (MOSFET) and an n-channel MOSFET. A resulting output impedance of such driver stages can made to equal a characteristic impedance of a transmission line.

The above parallel termination arrangement for a signal reception end is adapted for use with a high speed bus, as signal reflection can be reduced or eliminated. However, in such an arrangement a reception end can be connected to a power supply voltage (or ground potential) through a terminal resistor. Thus, a signal voltage is divided with an output impedance of a signal transmission side and the terminal resistor. As a result, a signal amplitude is decreased in order to increase noise margin. In addition, in the above parallel termination arrangement, a current will flow between a power supply voltage and ground potential through a terminal resistor, which may have a relatively low resistance. This can result in increased power consumption. Still further, adding a terminal resistor to various inputs can increase a resulting cost of a device.

In the case of a series termination made on a signal transmission side, because an output impedance can be made to match a characteristic impedance of a transmission line, there is no need to provide a terminal resistor. Thus, a signal transmission side can provide reduction in noise while at the same time preventing power consumption resulting from a terminal resistor. However, signal transmission side termination can have drawbacks, as signals reflected on a reception side are terminated on the transmission side. Consequently, if a series termination is applied to a bus arrangement, it can take more time to transfer a signal, as one portion of a bus can be closer to a signal transmission end. That is, a signal will have to make a round trip through an entire bus-type transmission line between the transmission of the signal and reception of the corresponding reflected signal.

In one-to-one communication, signal transmission sides can have a one-to-one correspondence with a signal reception. Thus, in such arrangements it is preferable to provide series termination on a signal transmission side, as this can reduce power consumption and reduce noise margin, as noted above.

To better understand the invention, an example of a conventional series termination arrangement, configured for one-to-one communication, will now be described.

Referring now to FIG. 8, an eye diagram is set forth showing a data transfer waveform for a conventional series termination arrangement.

In recent years, high speed data transfer interfaces have utilized a data reception circuit that includes an input buffer circuit with a differential amplifier circuit that meets the series stub terminated logic (SSTL) standard. In such an input buffer circuit, the level of a received signal is judged with respect to a reference voltage Vref (normally, Vref= Vdd/2). Received data can be pulse shaped, and the input buffer circuit can provide an output signal according to such a comparison with a reference voltage Vref level.

However, a reference voltage Vref provided to an input buffer circuit may vary (from Vref+ to Vref−) due to uncontrollable conditions, such as ambient temperature, for example. Thus, to improve the stability of data reception, it is preferable that in a response like that of FIG. 8, an opening in the eye diagram be made as large as possible.

A first conventional series termination arrangement is shown by waveform 800. Waveform 800 shows how a series termination arrangement can provide a low noise response, hence the width of the signal can be relatively narrow. However, such an arrangement can have drawbacks. When an output impedance of an output buffer is made to match the characteristic impedance of a transmission line, a driving ability of such a circuit can be restricted. This results in the rise/fall time (referred to herein as the AC performance) of a driven pulse signal being lengthened. Consequently, if a desired data transfer rate is relatively high, it can be impossible to provide a response with a sufficiently large opening when represented by an eye diagram.

An output impedance of an output buffer can be reduced to thereby increase driving ability. This can shorten rise/fall times with respect to an impedance matched output buffer circuit. However, because a signal transmission end is no longer terminated with a matching impedance, reflected noise is generated, increasing a jitter component of a response. Such a second conventional arrangement is shown by waveform 802. As shown, additional noise an result in a waveform 802 of increased width when represented by an eye diagram.

In light of the above, it would desirable to provide an output buffer circuit that can have enhanced AC performance and noise suppression with respect to conventional approaches. Such an arrangement can result in a response that presents an enlarged opening when represented by an eye diagram.

SUMMARY OF THE INVENTION

The present invention may include an output buffer circuit for sending output data signals on a transmission line according to input data signals supplied from an internal circuit. The output buffer circuit can include a plurality of driver circuits connected in parallel for sending output data signals on the transmission line. Each driver circuit can have a predetermined output impedance. The output buffer circuit can also include a signal judging circuit that can drive a first predetermined number of the driver circuits according to an input data signal when the input data signal is continuously at one value for a predetermined time period. Such a first predetermined number of driver circuits can have an output impedance that essentially matches a characteristic impedance of the transmission line. The signal judging circuit may also drive a second predetermined number of the driver circuits according to an input data signal, when the input data signal transitions. Such a second predetermined number of driver circuits can have an output impedance that is lower than the characteristic impedance of the transmission line.

According to one aspect of the embodiments, a signal judging circuit can include an input sampling circuit for generating at least two judging values corresponding to a state of the input data signal during at least two time periods. The two judging values can have a first combination of values when the input data signal is continuously at one value for a predetermined time period. The two judging values can have second combination of values when the input data signal transitions.

According to another aspect of the embodiments, an input sampling circuit can include a first register circuit for storing an input signal level in response to a clock signal, and a second register circuit for storing an output value from the first register circuit in response to the clock signal.

According to another aspect of the embodiments, an input sampling circuit can include a first flip-flop circuit for storing an input signal level in response to a system clock signal, and a second flip-flop circuit for storing an output value from the first flip-flop in response to the system clock signal.

According to another aspect of the embodiments, a first combination of judging values can include all judging values having the same logic level, and can represent an input signal value that maintains a constant level for a predetermined amount of time. A second combination of judging values can include the judging values having different logic levels that can represent an input signal that makes a transition.

According to another aspect of the embodiments, a judging circuit can include judging values having at least a first judging value representing a later sample of an input signal than a second judging value. A signal judging circuit can also include a control circuit for driving the first driver circuit in response to the first judging value.

According to another aspect of the embodiments, a signal judging circuit can include judging values having at least a first judging value representing a later sample of an input signal than a second judging value. A signal judging circuit can also include a control circuit that activates a second driver circuit in response to a first judging value when the first signal value and second judging value have a predetermined combination.

According to another aspect of the embodiments, an output buffer circuit and internal circuit according to the above embodiments can be portions of the same integrated circuit.

The present invention may include another output buffer circuit for sending output data signals on a transmission line according to input data signals supplied from an internal circuit. The output buffer circuit can include a first driver circuit for sending data signals on a transmission line through an output impedance essentially equal to a characteristic impedance of the transmission line and a second driver circuit connected in parallel with the first driver circuit. When the second driver circuit is activated with the first driver circuit, an output impedance of the output buffer circuit can be lower than the characteristic impedance of the transmission line. The output buffer circuit may also include a signal judging circuit for driving the first driver circuit and not the second driver circuit according to an input signal when the input data signal is continuously at one level, and driving the first driver circuit and second driver circuit according to an input signal when the input data signal makes a transition.

According to one aspect of the embodiments, a signal judging circuit can include a first flip-flop and a second flip-flop connected in series for latching an input signal according to the timing of a clock signal. In addition, a control circuit can drive a first driver circuit according to an output of the first flip-flop, can drive a second driver circuit according to the output of the first flip-flop when the output of the first flip-flop is different than an output of the second flip-flop, and can stop the operation of the second flip-flop when the output of the first flip-flop is the same as the output of the second flip-flop.

According to another aspect of the embodiments, a control circuit can include a driver circuit for supplying a drive signal to the first driver circuit in accordance with the output of a first flip-flop. A control circuit can also include a first logic circuit for outputting a logical combination of the output of the first flip-flop and a second flip-flop, and a second logic circuit for outputting a logical combination of the output of the first flip-flop and the second flip-flop. In addition, a third logic circuit can output a logical combination of the output of the first flip-flop and an output of the first logic circuit to the second driver circuit, and a fourth logic circuit can output a logical combination of the output of the first flip-flop and an output of the second logic circuit to the second driver circuit.

According to another aspect of the embodiments, in the above arrangement, a driver circuit can include an inverter, a first logic circuit can include a logical OR-type gate, and a second logic circuit can include a logical AND-type gate. In addition, a third logic circuit can include a logical NAND-type gate and provide an output value to a first conductivity type output transistor within the second driver circuit, and a fourth logic circuit can include a logical NOR-type gate, and can provide an output value to a second conductivity type output transistor within the second driver circuit.

According to another aspect of the embodiments, a control circuit can include a driver circuit for supplying a drive signal to the first driver circuit in accordance with the output of a first flip-flop, a first logic circuit for outputting a logical combination of the output of the first flip-flop and a second flip-flop, and a second logic circuit for outputting a logical combination of the output of the first flip-flop and the second flip-flop. A control circuit may also include a first transfer gate and second transfer gate for supplying a first drive signal to the second driver circuit, and a third transfer gate and fourth transfer gate for supplying a second drive signal to the second driver circuit.

According to another aspect of the embodiments, in the above arrangement, a driver circuit can include an inverter, a first logic circuit can include a logical NAND-type gate and a second logic circuit can include a logical NAND-type gate. In addition, a first transfer gate and second transfer gate can be enabled in response to an output of the first logic circuit, and a third transfer gate and fourth transfer gate can be enabled in response to an output of the second logic circuit.

According to another aspect of the embodiments, first drive signal and second drive signal can be generated from the output of a driver circuit.

The present invention may also include an output buffer circuit having at least one first driver circuit coupled to a transmission line that includes an output impedance that essentially matches a characteristic impedance of the transmission line, and at least one second driver circuit coupled in parallel with the at least one first driver circuit. The output buffer circuit may also have a signal judging circuit that includes a control circuit that activates the second driver circuit in response to a transition in a received input signal, and deactivates the second driver circuit in response to the received input signal maintaining a same value for a predetermined period of time.

According to one aspect of the embodiments, the at least one second driver circuit can include a first conductivity type driver transistor and a second conductivity type driver transistor. In addition, a control circuit can include a first logic gate having one input coupled to a first detect signal, a second input coupled to a logical combination of the first detect signal and a second detect signal, and an output coupled to the first conductivity type driver transistor. The control circuit may further include a second logic gate having one input coupled to the first detect signal, a second input coupled to a different logical combination of the first detect signal and the second detect signal, and an output coupled to the second conductivity type driver transistor.

According to another aspect of the embodiments, the at least one second driver circuit can include a first conductivity type driver transistor and a second conductivity type driver transistor. In addition, a control circuit can include a first transfer gate that is enabled in response to a first logical combination of a first detect signal and a second detect signal that includes an input coupled the first detect signal and an output coupled to the first conductivity type driver transistor. A second transfer gate can be enabled in response to a second logical combination of the first detect signal and the second detect signal, and can include an input coupled to the first detect signal and an output coupled to the second conductivity type driver transistor.

According to another aspect of the embodiments, a signal judging circuit can further include a first judging circuit coupled to a signal input that outputs a first detect signal corresponding to a detected level of the received input signal, and a second judging circuit stores the detected level from the first judging circuit, and that outputs a second detect signal.

According to another aspect of the embodiments, a first judging circuit can store a detected level of a received input signal in response to a periodic signal, and a second judging circuit can store the detected level in response to a periodic signal.

DETAILED DESCRIPTION OF THE EMBODIMENTS

The present invention will hereinafter be described in more detail on the basis of various particular embodiments with reference to accompanying figures.

Figure 1:
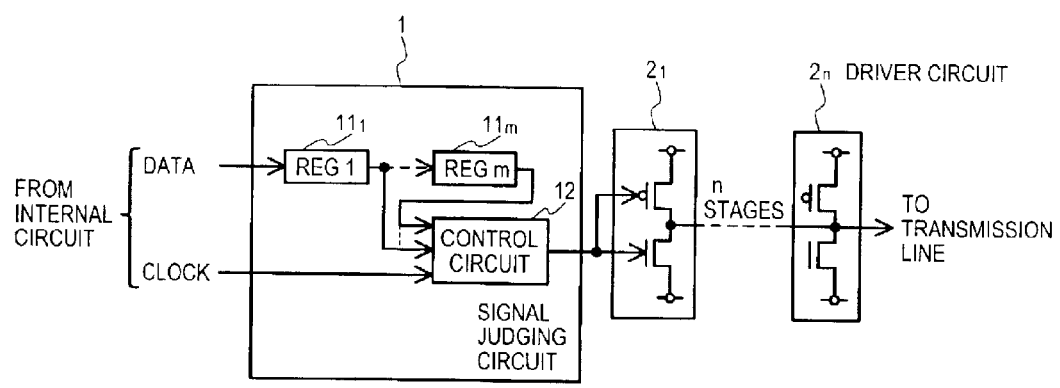
FIG. 1 is a block diagram showing one example of an output buffer circuit according to one embodiment the present invention.
Figure 2:
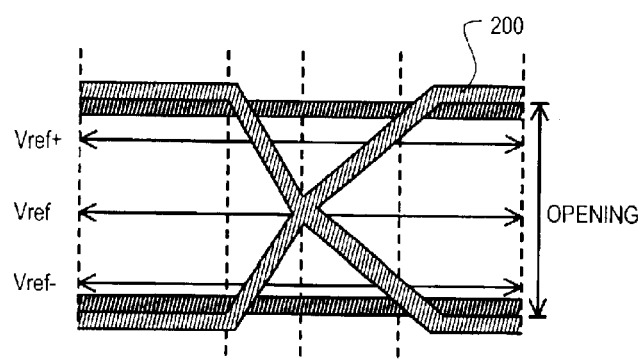
FIG. 2 is an "eye" diagram showing a data transmission waveform for the output buffer circuit of FIG. 1.

FIG. 1 is a block diagram showing one example of an output buffer circuit according to the present invention. FIG. 2 is an eye diagram showing one example of a data transmission response for an output buffer circuit like that of FIG. 1.

Referring now to FIG. 1, an output buffer circuit according to one embodiment can include n (where n is a positive integer) driver circuits $2_1$ to $2_n$ and a signal judging circuit 1. Driver circuits ($2_1$ to $2_n$) can be connected in parallel with one another and send data signals to a transmission line. Driver circuits ($2_1$ to $2_n$) can have predetermined output impedances. Signal judging circuit 1 can detect the presence or absence of a transition in a data signal Data supplied from the internal control circuit, to thereby control the operation of driver circuits ($2_1$ to $2_n$) according to a detection result.

A signal judging circuit 1 can include m (where m is a positive integer) registers (Reg1 to Regm) $11_1$ to $11_n$ and a control circuit 12. Registers ($11_1$ to $11_m$) can be connected in series with one another to latch data signals supplied from an internal circuit. Latching operations can be based on a timing of a system clock Clock. Such an arrangement can detect the presence or absence of a transition in a data signal on the basis of output values provided by registers ($11_1$ to $11_m$), and thereby supply drive signals to predetermined driver circuits ($2_1$ to $2_n$) in accordance with a detection result.

In one particular arrangement, a control circuit 12 can compare the output values of registers (11$_1$ to 11$_m$) with one another. When same output values (e.g., all "0" or all "1") are continuously supplied, a control circuit 12 can operate a predetermined number of driver circuits (2$_1$ to 2$_n$) so that an output impedance of such driver circuits matches a characteristic impedance of a transmission line. On the other hand, when a transition in a signal value is detected, a control circuit 12 can increase the number of driver circuits (2$_1$ to 2$_n$) to enhance the driving ability of the output buffer circuit. Thus, at such a transition time, an output signal can be driven on a transmission line through a lower output impedance than a characteristic impedance of the transmission line.

In this way, by including a signal judging circuit 1, at the time when a data signal supplied from an internal circuit makes a transition, a driving ability of an output buffer circuit can be enhanced and a resulting output impedance can be reduced. However, when a predetermined number of output values having the same value are continuously supplied, the output impedance of the output buffer circuit can be made to essentially match the characteristic impedance of the transmission line.

Referring to FIG. 2, an eye diagram is set forth showing a response of an output buffer circuit like that of FIG. 1. As shown by waveform 200 in FIG. 2, an AC performance can be enhanced by enabling rise/fall times to be reduced. At the same time, reflected noise can be suppressed, resulting in an eye diagram having an increased opening size.

More particular embodiments of the present invention will now be described.

Figure 3:
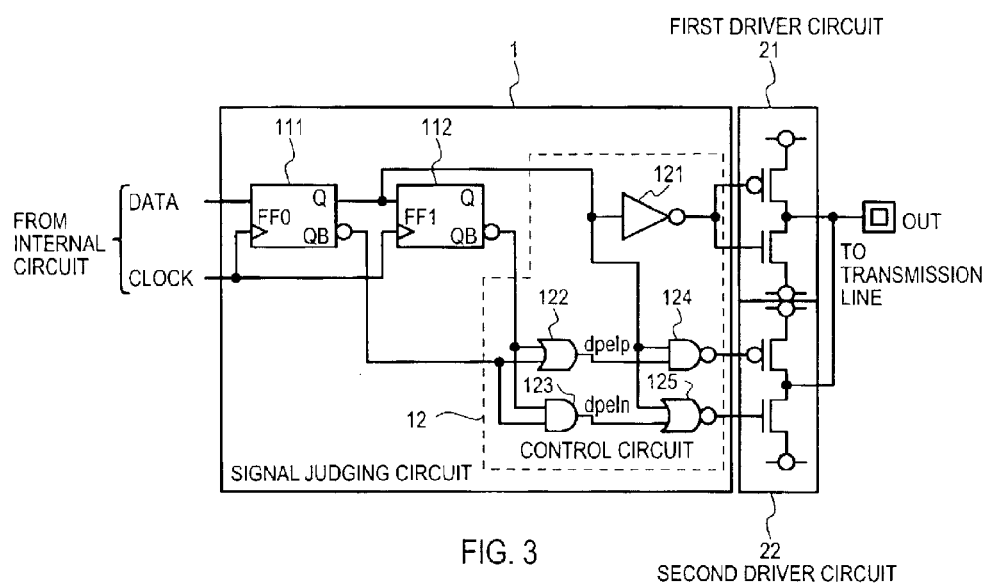
FIG. 3 is a circuit diagram of an output buffer circuit according to a first detailed embodiment of the present invention.
Figure 4:
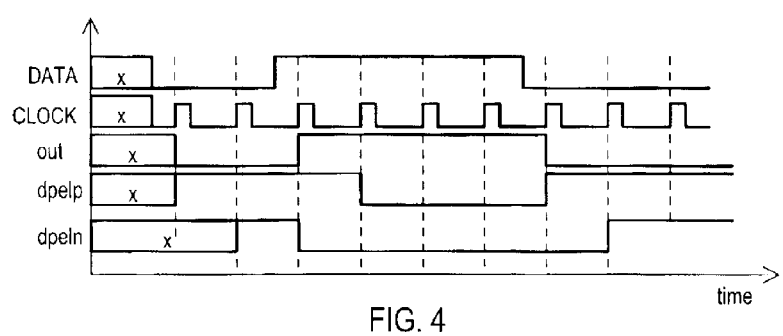
FIG. 4 is a timing diagram showing the operation of the output buffer circuit of FIG. 3.

FIG. 3 is a circuit diagram showing an output buffer circuit according to a first particular embodiment. FIG. 4 is a timing chart showing the operation of the output buffer circuit set forth in FIG. 3.

As shown in FIG. 3, an output buffer circuit according a first particular embodiment can include a first driver circuit 21, a second driver circuit 22, and a signal judging circuit 1. A first driver circuit 21 can send data signals to a transmission line through an output impedance that can be essentially equal to a characteristic impedance of the transmission line. A second driver circuit 22 can be connected in parallel with first driver circuit 21, and can be driven in parallel with the first driver circuit 21 to send a signal through an output impedance that is smaller than a characteristic impedance of a transmission line.

A signal judging circuit 1 can detect the presence or absence of a transition of a data signal DATA supplied from outside the output buffer circuit, and control the operation of first driver circuit 21 and second driver circuit 22 according to such a detection result.

In the particular embodiment of FIG. 3, a signal judging circuit 1 can include a first flip-flop (FF0) 111, a second flip-flop (FF1) 112, and a control circuit 12. A first flip-flop (FF0) 111 and second flip-flop (FF1) 112 can be connected in series for latching data signals supplied from an internal circuit according to a clock signal (Clock). A clock signal (Clock) may be a system clock, for example.

A control circuit 12 can control the operation of a first driver circuit 21 and second driver circuit 22 according to output values of first and second flip-flops (111 and 112). In particular, if a data signal transition is not detected, a first driver circuit 21 can be activated while a second driver circuit 22 can remain inactive. However, if a data signal transition is detected, a first driver circuit 21 and second driver circuit 22 can both be activated. In one particular arrangement, a first driver circuit 21 can be controlled by a first flip-flop 111 and a second driver circuit 22 can be controlled by both a first flip-flop 111 and a second flip-flop 112. When output values from first and second flip-flops (111 and 112) are different from one another, both a first driver circuit 21 and second driver circuit 22 can be operated. However, when output values are the same, a first flip-flop 111 can be operated while the operation of a second flip-flop 112 can be ceased. It is noted that in one arrangement, first and second flip-flops (111 and 112) can correspond to registers shown as 11$_1$ to 11$_m$ in FIG. 1.

Referring still to FIG. 3, a first driver circuit 21 can include a transistor of a first conductivity type and a transistor of a second conductivity type connected in a push-pull fashion. More particularly, a first driver circuit can include a p-channel metal-insulator-semiconductor (MOS) transistor and an n-channel MOS transistor connected to one another in a push-pull fashion. Sizes of such transistors can be optimized to enable an output impedance to match a characteristic impedance of a transmission line.

In addition, a second driver circuit 22 can include a transistor of a first conductivity type and a transistor of a second conductivity type connected in a push-pull fashion. More particularly, a first driver circuit can include a p-channel MOS transistor and an n-channel MOS transistor connected to one another in a push-pull fashion. The sizes of the transistors of the second driver circuit 22 can be set to obtain a desired rise/fall time when the first driver circuit 21 is driven concurrently with a second driver circuit 22. This can improve AC performance. In addition, at such a time, an output impedance of the output buffer circuit can be lower than when only the first driver circuit 21 is driven.

A control circuit 12 may particularly include an inverter 121, a first logic gate 122, a second logic gate 123, a third logic gate 124, and a fourth logic gate 125. An inverter 121 can supply a drive signal to transistors of a first driver circuit 21. A first logic gate 122 can be an OR-type gate that can output a logical sum of an output value (QB) of a first flip-flop 111 and an output value (QB) of a second flip-flop 112. A second logic gate 123 can be an AND-type gate that can output a logical product of an output value (QB) of a first flip-flop 111 and an output value (QB) of a second flip-flop 112. A third logic gate 124 can be a NAND-type gate that can output a logical product of an output value (Q) of a first flip-flop 111 and an output of first logic gate 122 to control a p-channel transistor of second driver circuit 22. A fourth logic gate 125 can be a NOR-type gate that can output a logical sum of an output value (Q) of a first flip-flop 111 and an output of second logic gate 123 to control an n-channel transistor of second driver circuit 22.

As shown in FIG. 4, in an output buffer circuit like that of FIG. 3, when a "1" value is continuously supplied as a data value (DATA) for at least two clocks of a clock signal (CLOCK), an output of first logic gate 122 (dpelp) can be a "0" value. Because an output of first flip-flop 111 (Q) has a "1" value, a p-channel MOSFET of second driver circuit 22 can be turned off by operation of third logic gate 124. As a result, a high data signal can be supplied to a transmission line through only p-channel MOSFET of the first driver circuit 21.

When a "0" value is continuously supplied as a data value (DATA) for at least two clocks of a clock signal (CLOCK), an output of second logic gate 123 (dpeln) can be a "1" value. Because an output of first flip-flop 111 (Q) has a "0" value, an n-channel MOSFET of second driver circuit 22 can be turned off by operation of fourth logic gate 125. As a result, a low data signal can be supplied to a transmission line through only an n-channel MOSFET of the first driver circuit 21.

The above noted states can be maintained until a data signal (DATA) makes a transition. For example, it will be assumed that a data signal (DATA) has a value "0" for at least two cycles of a clock signal (CLOCK), and then makes a transition from values "0" to "1". An output value from first flip-flop 111 (QB) will transition from a "1" to a "0" value. However, an output value from second flip-flop 112 (QB) can remain at a "1" value. Consequently, an output of first logic gate 122 (dpelp) can remain at a "1" value, and supply such a value to an input of third logic gate 124. However, at the same time, a non-inverted output from first flip-flop 111 (Q) can transition from a "0" to "1" value, thus supplying two "1" values to third logic gate 124. As a result, third logic gate 124 can turn on a p-channel MOSFET within second driver circuit 22. Thus, an output signal may be driven by p-channel MOSFETs in both a first and second driver circuit (21 and 22).

On the other hand, if a data signal (DATA) has a value of "1" for at least two cycles of a clock signal (CLOCK), and then makes a transition from values "1" to "0", a pull-down device (e.g., n-channel MOSFET) can be activated in a second driver circuit 22. As but one particular example, when a data signal (DATA) transitions from a "1" to "0" value, an output value from first flip-flop 111 (QB) can transition from a "0" to a "1" value. However, an output value from second flip-flop 112 (QB) can remain at a "0" value. Consequently, an output of second logic gate 123 (dpeln) can remain at a "0" value, and supply such a value to an input of fourth logic gate 125. However, at the same time, a non-inverted output from first flip-flop 111 (Q) can transition from a "1" to "0" value, thus supplying two "0" values to fourth logic gate 125. As a result, fourth logic gate 125 can turn on an n-channel MOSFET within second driver circuit 22. Plus, an output signal may be driven by n-channel MOSFETs in both a first and second driver circuit (21 and 22).

Accordingly, the above embodiment shows how additional driving capabilities may be enabled during signal transitions, and disabled after such transitions are completed. In particular, when a data signal (DATA) makes a transition from a "0" to "1" value, a "1" value can be sent on a transmission line by operation of a p-channel MOSFET in first driver circuit 21 and a channel MOSFET in second driver circuit 22 in synchronism with a first rise of a clock signal (CLOCK) following such a transition in a data signal (DATA). Further, when a data signal (DATA) makes a transition from a "1" to "0" value, a "0" value can be sent on a transmission line by operation of an n-channel MOSFET in first driver circuit 21 and an n-channel MOSFET in second driver circuit 22 in synchronism with a first rise of a clock signal (CLOCK), following such a data signal (DATA) transition.

In this way, according to the above embodiment, at the time when a data signal (DATA) supplied from an internal circuit makes a transition, first driver circuit 21 and second driver circuit 22 may drive a signal in parallel, resulting in a lower output impedance but enhanced driving ability. When a same data signal (DATA) is supplied for two clock signals (CLOCK), a signal can be driven with a first driver circuit 21 and not second driver circuit 22 to provide an output impedance that essentially matches a characteristic impedance of a corresponding transmission line. In such an arrangement, AC performance can be enhanced, as signal rise/fall times can be reduced from enhanced driving, and the generation of reflected noise can be reduced as impedance matching occurs following signal transitions. An end result can be a response that presents a larger opening than conventional arrangements when represented by an eye diagram.

Figure 5:
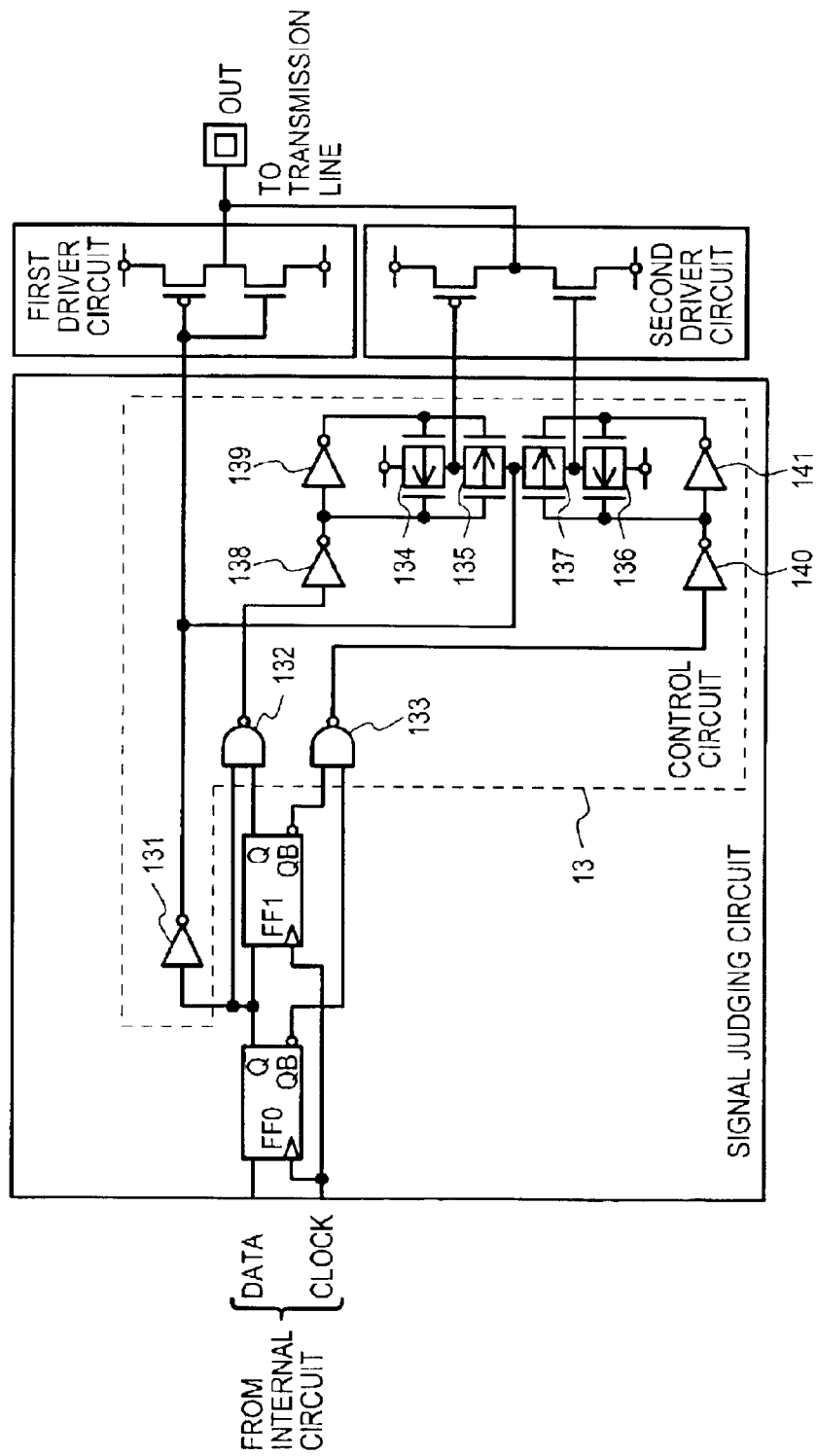
FIG. 5 is a circuit diagram of an output buffer circuit according to a second detailed embodiment of the present invention.
Figure 6:
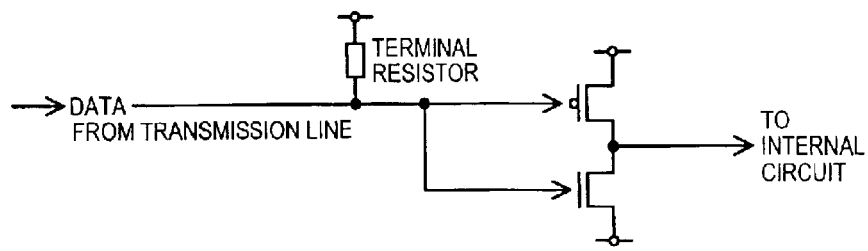
FIG. 6 is a circuit diagram showing a conventional parallel termination arrangement on a signal reception side.
Figure 7:
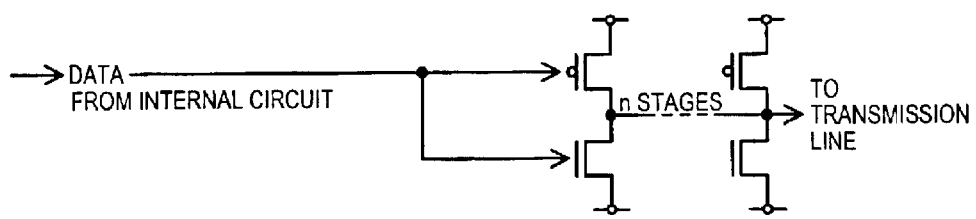
FIG. 7 is a circuit diagram showing a conventional series termination arrangement on a signal transmission side.
Figure 8:
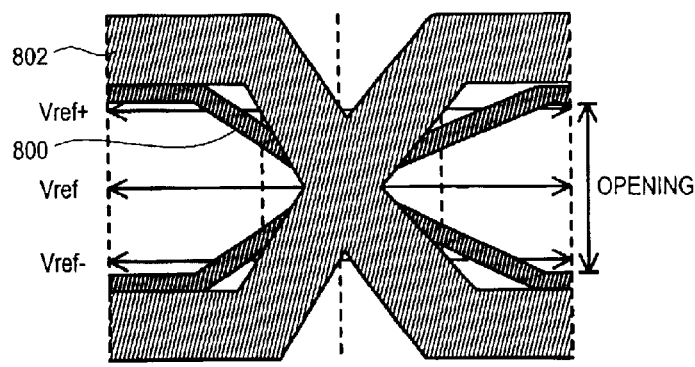
FIG. 8 is an "eye" diagram showing a conventional data transmission waveform response.

FIG. 5 is a circuit diagram showing an output buffer circuit according to a second particular embodiment. In FIG. 5, a signal judging circuit can vary from that of FIG. 3, while other portions can be the same. Accordingly, descriptions of like portions will be omitted to avoid repetition.

In the arrangement of FIG. 5, a control circuit 13 may particularly include a first inverter 131, a first logic gate 132, and a second logic gate 133. A first inverter 131 may receive an output value (Q) from a first flip-flop (FF0), and provide a drive signal for transistors of a first driver circuit. A first driver circuit can include a p-channel MOSFET and n-channel MOSFET. A first logic gate 132, which can be a NAND gate, can provide a logical product of an output value (Q) from a first flip-flop (FF0) and an output value (Q) from a second flip-flop (FF1). A second logic gate 133, which can be a NAND gate, can provide a logical product of an output value (QB) from a first flip-flop (FF0) and an output value (QB) from a second flip-flop (FF1).

A control circuit 13 may also include a first transfer gate 134, second transfer gate 135, third transfer gate 136, fourth transfer gate 137, second inverter 138, third inverter 139, fourth inverter 140, and fifth inverter 141. A first transfer gate 134 and second transfer gate 135 connected in series with one another, and provide a drive signal for a p-channel MOSFET of a second driver circuit. A third transfer gate 136 and fourth transfer gate 137 may be connected in series with one another, and provide a drive signal for an n-channel MOSFET of a second driver circuit. A second inverter 138 and third inverter 139 can be arranged in series and operate first transfer gate 134 and second transfer gate 135 according to an output of first logic gate 132. A fourth inverter 140 and fifth inverter 141 can be arranged in series and operate third transfer gate 136 and fourth transfer gate 137 according to an output of second logic gate 133. In addition, second transfer gate 135 can be arranged in series with fourth transfer gate 137, and have a common connection point connected to an output of first inverter 131.

In a configuration like that of FIG. 5, when a "1" value is continuously supplied as data signal (DATA) for at least two clocks (CLOCK), first logic gate 132 can output a logic low value, thereby turning on first transfer gate 134 and turning off second transfer gate 135. In such an arrangement a "1" value (e.g., a high supply voltage) can be provided to a p-channel MOSFET within second driver circuit, turning off the p-channel MOSFET. In this way, a data signal can be supplied to a transmission line by a p-channel transistor within the first driver circuit, but not the second driver circuit.

When a "0" value is continuously supplied as data signal (DATA) for at least two clocks (CLOCK), second logic gate 133 can output a logic low value, thereby turning on third transfer gate 136 and turning off fourth transfer gate 137. In such an arrangement a "0" value (e.g., a low supply voltage) can be provided to an n-channel MOSFET within second driver circuit, turning off the n-channel MOSFET. In this way, a data signal can be supplied to a transmission line by an n-channel transistor within the first driver circuit, but not from the second driver circuit.

The above noted states can be maintained until a data signal (DATA) makes a transition. For example, it will be assumed that a data signal (DATA) has a value "0" for at least two cycles of a clock signal (CLOCK), and then makes a transition from values "0" to "1". An output value (Q) from a first flip-flop (FF0) can transition from "0" to "1", while an inverted output value (QB) from a first flip-flop (FF0) can transition from "1" to "0". As a result, an output of first inverter 131 can transition from a "1" to "0" value. However, output values (Q and QB) from second flip-flop (FF1) can remain at a "0" and "1" values, respectively. Consequently, an output of first logic gate 132 can remain at a "1" value, resulting in first transfer gate 134 being turned off, and second transfer gate 135 being turned on. In such an arrangement, a low output of first inverter 131 can be applied through second transfer gate 135 to turn on a p-channel MOSFET within a second driver circuit. Thus, an output signal may be driven by p-channel MOSFETs in both a first and second driver circuit.

On the other hand, if a data signal (DATA) has a value "1" for at least two cycles of a clock signal (CLOCK), and then makes a transition from values "1" to "0", an output value (Q) from a first flip-flop (FF0) can transition from "1" to "0", while an inverted output value (QB) from a first flip-flop (FF0) can transition from "0" to "1". As a result, an output of first inverter 131 can transition from a "0" to "1" value. However, output values (Q and QB) from second flip-flop (FF1) can remain at a "1" and "0" values, respectively. Consequently, an output of second logic gate 133 can remain at a "1" value, resulting in third transfer gate 136 being turned off, and fourth second transfer gate 137 being turned on. In such an arrangement, a high output of first inverter 131 can be applied through fourth transfer gate 137 to turn on an n-channel MOSFET within a second driver circuit. Thus, an output signal may be driven by n-channel MOSFETs in both a first and second driver circuit.

Accordingly, the above second detailed embodiment has shown how additional driving capabilities may be enabled during signal transitions, and disabled after such transitions are completed. In particular, when a data signal (DATA) makes a transition from a "0" to "1" value, a "1" value can be sent on a transmission line by operation of a p-channel MOSFET in a first driver circuit and a p-channel MOSFET in a second driver circuit, in synchronism with a first rise of a clock signal (CLOCK) following such a transition in a data signal (DATA). Further, when a data signal (DATA) makes a transition from a "1" to "0" value, a "0" value can be sent on a transmission line by operation of an n-channel MOSFET in a first driver circuit and an n-channel MOSFET in a second driver circuit, in synchronism with a first rise of a clock signal (CLOCK), following such a data signal (DATA) transition.

In this way, according to the embodiment of FIG. 5, AC performance can be enhanced, as signal rise/fall times can be reduced from enhanced driving, and the generation of reflected noise can be reduced as impedance matching occurs following signal transitions. An end result can be a response that presents a larger opening, when represented by an eye diagram, than conventional arrangements.

Still further, because the arrangement of FIG. 5 employs transfer gates for driving an n-channel MOSFET and p-channel MOSFET within a second transfer gate, the speed at which such driver transistors can be turned on and off can be faster than arrangements using logic gates, such as that shown in FIG. 3. In this way, activation timing of a second driver circuit can be made to correspond more closely with that of the first driver circuit.

The above embodiments have shown particular examples of the present invention that may offer the following effects.

When a data signal supplied from an internal circuit makes a transition, an output impedance of an output buffer circuit can be made small, to thereby enhance a driving ability of the output buffer circuit. However, when the supplied data signal has the same value for a predetermined period of time, the output impedance of the output buffer circuit can be made to match the characteristic impedance of a transmission line.

Consequently, the above embodiments of the present invention can enhance the AC performance of an output buffer circuit by shortening rise/fall times. However, reflected noise may also be reduced. A resulting data transfer response, when represented by an eye diagram, can have a larger opening than conventional approaches.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. An output buffer circuit for sending output data signals on a transmission line according to input data signals supplied from an internal circuit, comprising:
   a plurality of driver circuits connected in parallel for sending output data signals on the transmission line, each driver circuit having a predetermined output impedance; and
   a signal judging circuit that drives a first predetermined number of the driver circuits according to an input data signal and provides an output impedance that essentially matches a characteristic impedance of the transmission line, when the input data signal is continuously at one value for a predetermined time period, and drives a second predetermined number of the driver circuits according to an input data signal and provides an output impedance for the buffer circuit that is lower than the characteristic impedance of the transmission line, when the input data signal transitions.

2. The output buffer circuit of claim 1, wherein:
   the signal judging circuit includes an input sampling circuit that generates at least two judging values corresponding to a state of the input data signal during at least two time periods, the at least two judging values having a first combination of values when the input data signal is continuously at one value for a predetermined time period, and having a second combination of values when the input data signal transitions.

3. The output buffer circuit of claim 2, wherein:
   the input sampling circuit includes
   a first register circuit that stores an input signal level in response to a clock signal, and
   a second register circuit that stores an output value from the first register circuit in response to the clock signal.

4. The output buffer circuit of claim 2, wherein:
   the input sampling circuit includes
   a first flip-flop circuit that stores an input signal level in response to a system clock signal, and
   a second flip-flop circuit that stores an output value from the first flip-flop in response to the system clock signal.

5. The output buffer circuit of claim 2 wherein:
   the first combination of judging values includes all judging values having the same logic level, and
   the second combination of judging values includes the judging values having different logic levels.

6. The output buffer circuit of claim 2, wherein:
the signal judging circuit includes
the judging values including at least a first judging value representing a later sample than a second judging value, and
a control circuit for driving the first driver circuit in response to the first judging value.

7. The output buffer circuit of claim 2, wherein:
the signal judging circuit includes
the judging values including at least a first judging value representing a later sample than a second judging value, and
a control circuit that activates the second driver circuit in response to a first judging value when the first judging value and second judging value have a predetermined combination.

8. The output buffer circuit of claim 1, wherein:
the output buffer circuit and internal circuit are portions of the same integrated circuit.

9. An output buffer circuit for sending output data signals on a transmission line according to input data signals supplied from an internal circuit, comprising:
a first driver circuit that sends data signals on a transmission line through an output impedance essentially equal to a characteristic impedance of the transmission line;
a second driver circuit connected in parallel with the first driver circuit that provides an output buffer circuit output impedance that is lower than the characteristic impedance of the transmission line when activated with the first driver circuit; and
a signal judging circuit that drives the first driver circuit and not the second driver circuit according to an input signal when the input data signal is continuously at one level, and driving the first driver circuit and second driver circuit according to an input signal when the input data signal makes a transition.

10. The output buffer circuit of claim 9, wherein:
the signal judging circuit includes
a first flip-flop and a second flip-flop connected in series that latch an input signal according to the timing of a clock signal; and
a control circuit that drives the first driver circuit according to an output of the first flip-flop, drives the second driver circuit according to the output of the first flip-flop when the output of the first flip-flop is different than an output of the second flip-flop, and stops the operation of the second driver circuit when the output of the first flip-flop is the same as the output of the second flip-flop.

11. The output buffer circuit of claim 10, wherein:
the control circuit includes
a driver circuit that supplies a drive signal to the first driver circuit in accordance with the output of the first flip-flop,
a first logic circuit that outputs a logical combination of the output of the first flip-flop and the second flip-flop,
a second logic circuit that outputs a logical combination of the output of the first flip-flop and the second flip-flop,
a third logic circuit that outputs a logical combination of the output of the first flip-flop and an output of the first logic circuit to the second driver circuit, and
a fourth logic circuit that outputs a logical combination of the output of the first flip-flop and an output of the second logic circuit to the second driver circuit.

12. The output buffer circuit of claim 11, wherein:
the driver circuit includes an inverter;
the first logic circuit includes a logical OR-type gate;
the second logic circuit includes a logical AND-type gate;
the third logic circuit includes a logical NAND-type gate, and provides an output value to a first conductivity type output transistor within the second driver circuit; and
the fourth logic circuit includes a logical NOR-type gate, and provides an output value to a second conductivity type output transistor within the second driver circuit.

13. The output buffer circuit of claim 10, wherein:
the control circuit includes
a driver circuit that supplies a drive signal to the first driver circuit in accordance with the output of the first flip-flop,
a first logic circuit that outputs a logical combination of the output of the first flip-flop and the second flip-flop,
a second logic circuit that outputs a logical combination of the output of the first flip-flop and the second flip-flop,
a first transfer gate and second transfer gate that supply a first drive signal to the second driver circuit; and
a third transfer gate and fourth transfer gate that supply a second drive signal to the second driver circuit.

14. The output buffer circuit of claim 13, wherein:
the driver circuit includes an inverter;
the first logic circuit includes a logical NAND-type gate;
the second logic circuit includes a logical NAND-type gate;
the first transfer gate and second transfer gate are enabled in response to an output of the first logic circuit; and
the third transfer gate and fourth transfer gate are enabled in response to an output of the second logic circuit.

15. The output buffer circuit of claim 13, wherein:
the first drive signal is generated from the output of the driver circuit; and
the second drive signal is generated from the output of the driver circuit.

16. An output buffer circuit, comprising:
at least one first driver circuit coupled to a transmission line that includes an output impedance that essentially matches a characteristic impedance of the transmission line;
at least one second driver circuit coupled in parallel with the at least one first driver circuit; and
a signal judging circuit that includes a control circuit that activates the second driver circuit in response to a transition in a received input signal, and deactivates the second driver circuit in response to the received input signal maintaining a same value for a predetermined period of time.

17. The output buffer circuit of claim 16, wherein:
the at least one second driver circuit includes a first conductivity type driver transistor and a second conductivity type driver transistor; and
the control circuit includes
a first logic gate having one input coupled to a first detect signal, a second input coupled to a logical combination of the first detect signal and a second detect signal, and an output coupled to the first conductivity type driver transistor, and
a second logic gate having one input coupled to the first detect signal, a second input coupled to a different logical combination of the first detect signal and the second detect signal, and an output coupled to the second conductivity type driver transistor.

18. The output buffer circuit of claim 16, wherein:

the at least one second driver circuit includes a first conductivity type driver transistor and a second conductivity type driver transistor; and the control circuit includes
- a first transfer gate that is enabled in response to a first logical combination of a first detect signal and a second detect signal, and that includes an input coupled the first detect signal and an output coupled to the first conductivity type driver transistor, and
- a second transfer gate that is enabled in response to a second logical combination of the first detect signal and the second detect signal, and that includes an input couple the first detect signal and an output coupled to the second conductivity type driver transistor.

19. The output buffer circuit of claim 16, wherein:

the signal judging circuit further includes
- a first judging circuit coupled to a signal input that outputs a first detect signal corresponding to detected level of the received input signal, and
- a second judging circuit stores the detected level from the first judging circuit and outputs a second detect signal.

20. The output buffer circuit of claim 19, wherein:

the first judging circuit stores the detected level of the received input signal in response to a periodic signal; and the second judging circuit stores the detected level in response to a periodic signal.

* * * * *